(12) United States Patent
Mori et al.

(10) Patent No.: US 7,928,650 B2
(45) Date of Patent: Apr. 19, 2011

(54) ORGANIC EL DISPLAY APPARATUS

(75) Inventors: Toshifumi Mori, Tokyo (JP); Koichi Suzuki, Yokohama (JP); Akira Tsuboyama, Machida (JP); Satoru Shiobara, Kawasaki (JP); Kenichi Ikari, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 29 days.

(21) Appl. No.: 12/573,355

(22) Filed: Oct. 5, 2009

(65) Prior Publication Data
US 2010/0090593 A1 Apr. 15, 2010

(30) Foreign Application Priority Data

Oct. 10, 2008 (JP) .................................. 2008-264193
Sep. 28, 2009 (JP) .................................. 2009-222634

(51) Int. Cl.
*H05B 33/00* (2006.01)

(52) U.S. Cl. ........................ 313/504; 313/506; 313/113

(58) Field of Classification Search .................. None
See application file for complete search history.

(56) References Cited

U.S. PATENT DOCUMENTS

| 7,732,809 | B2 * | 6/2010 | Adachi et al. | .................. 257/40 |
| 7,767,316 | B2 * | 8/2010 | Deaton et al. | ................. 428/690 |
| 2009/0085454 | A1 * | 4/2009 | Li et al. | ............. 313/46 |
| 2010/0072880 | A1 * | 3/2010 | Adachi et al. | ................. 313/498 |

FOREIGN PATENT DOCUMENTS

JP 2004-241374 8/2004

* cited by examiner

*Primary Examiner* — Ashok Patel
(74) *Attorney, Agent, or Firm* — Fitzpatrick, Cella, Harper & Scinto

(57) ABSTRACT

Provided is an organic EL display apparatus including an organic EL device having a delayed fluorescence material which has good internal quantum efficiency and an organic EL device having a phosphorescent material. A soaking unit is provided in a plane in which the organic EL devices are provided.

2 Claims, 3 Drawing Sheets

FIG. 3
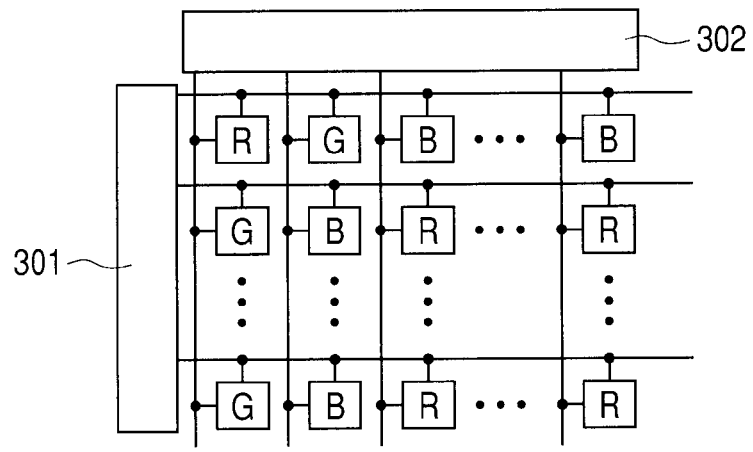
FIG. 4
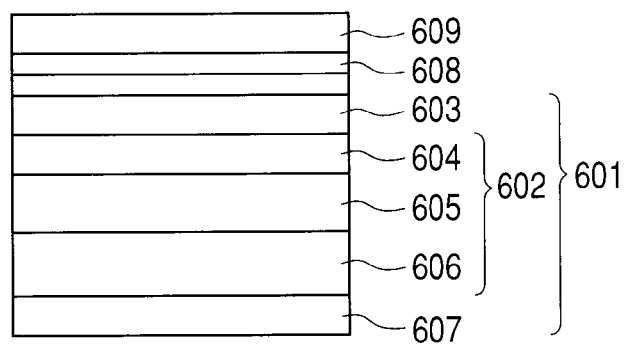
FIG. 5
| MATERIAL | THERMAL CONDUCTIVITY [W/(m·K)] |
|---|---|
| GRAPHITE | 800 |
| SILVER | 422 |
| COPPER | 395 |
| ALUMINIUM | 240 | ial in the light-emitting layer; at least one of the other devices has a phosphorescence material in the light-emitting layer; and the reflective electrode has a soaking member that is provided on a rear side of a light reflecting surface.

ORGANIC EL DISPLAY APPARATUS

BACKGROUND OF THE INVENTION

1. Field of the Invention

The present invention relates to an organic EL display apparatus having an organic EL device containing a delayed fluorescence material and a soaking member.

2. Description of the Related Art

Recently, research and development of an organic EL display apparatus using an organic EL device have actively been conducted.

The organic EL display apparatus has a plurality of red organic EL devices, green organic EL devices, and blue organic EL devices, each of which independently performs light emission and non-light emission as a pixel to display a full-color image.

The organic EL device has a pair of electrodes and a light-emitting layer that is disposed between the electrodes and formed of an organic compound.

A plurality of wirings are connected to the organic EL device. The wirings include a wiring transmitting gradation information for each wire, a wiring transmitting emission timing, and the like.

Also, a plurality of organic EL devices are connected to one wiring. One of the wirings serves to supply a current, and, when the plurality of organic EL devices are connected to the wiring, a large current flows to the organic EL device close to a power source to generate Joule heat which causes an increase in temperature. Also, depending on the position of the power source, the organic EL device close to the power source receives heat from the power source as compared to the organic EL device distant from the organic EL device. As a result, a temperature difference is caused between the plurality of organic EL devices disposed in a pixel region. Thus, emission luminance is varied between the organic EL devices even when identical information is so supplied as to achieve light emission of identical emission luminance. Therefore, uneven luminance is generated when pixels are compared to one another.

While fluorescence materials and phosphorescence materials have been developed, use of a delayed fluorescence material having high internal quantum efficiency for the organic EL device is disclosed in Japanese Patent Application No. 2004-241374.

Though Japanese Patent Application No. 2004-241374 discloses the organic EL device having the delayed fluorescence material, an organic EL display apparatus provided with red organic EL devices, green organic EL devices, and blue organic EL devices as pixels is not described nor suggested. Also, though the delayed fluorescence material is the one with which strong delayed fluorescence spectrum and phosphorescence spectrum are observed within a range of 520 to 750 nm, the emission wavelength actually shown in drawings has a maximum emission wavelength that is formed of a peak exceeding 550 nm and a peak exceeding 600 nm. In short, the disclosed delayed fluorescence material is not a light-emitting material that is capable of emitting any elementary color such as green and blue in terms of its color purity.

SUMMARY OF THE INVENTION

An object of the present invention is to provide an organic EL display apparatus that is free from uneven luminance even when an organic EL device having a phosphorescence material with high internal quantum yield and an organic EL device having a delayed fluorescence material with high internal quantum yield are provided on the same plane.

Thus, the present invention provides an organic EL display apparatus including; a plurality of pixels on a substrate, the plurality of pixels including a red-light-emitting pixel, a green-light-emitting pixel, and a blue-light-emitting pixel, and the red-light-emitting pixel, the green-light-emitting pixel, and the blue-light-emitting pixel having a red organic EL device, a green organic EL device, and a blue organic EL device, respectively, each of the red organic EL device, the green organic EL device, and the blue organic EL device having a reflective electrode, a transparent electrode opposed to the reflective electrode, and a light-emitting layer disposed between the reflective electrode and the transparent electrode, and the reflective electrode in each of the red organic EL device, the green organic EL device, and the blue organic EL device being disposed distant from or close to the substrate as compared to the transparent electrode, wherein; at least one of the red organic EL device, the green organic EL device, and the blue organic EL device has a delayed fluorescence material in the light-emitting layer; at least one of the other devices has a phosphorescence material in the light-emitting layer; and the reflective electrode has a soaking member that is provided on a rear side of a light reflecting surface.

According to the present invention, it is possible to provide an organic EL display apparatus that is free from uneven luminance even when an organic EL device having a phosphorescence material and an organic EL device having a delayed fluorescence material are provided the same plane.

Further features of the present invention will become apparent from the following description of exemplary embodiments with reference to the attached drawings.

BRIEF DESCRIPTION OF THE DRAWINGS

FIG. 3 is a block diagram schematically showing a structure of an organic EL display apparatus and disposition of RGB pixels.

FIG. 4 is a block diagram showing a structure of an organic EL device.

FIG. 5 is a diagram showing heat conductivities of substances.

DESCRIPTION OF THE EMBODIMENTS

The organic EL display apparatus according to the present invention includes; a plurality of pixels on a substrate, the plurality of pixels including a red-light-emitting pixel, a green-light-emitting pixel, and a blue-light-emitting pixel, and the red-light-emitting pixel, the green-light-emitting pixel, and the blue-light-emitting pixel having a red organic EL device, a green organic EL device, and a blue organic EL device, respectively, each of the red organic EL device, the green organic EL device, and the blue organic EL device having a reflective electrode, a transparent electrode opposed to the reflective electrode, and a light-emitting layer disposed between the reflective electrode and the transparent electrode; and the reflective electrode in each of the red organic EL device, the green organic EL device, and the blue organic EL device being disposed distant from or close to the substrate as compared to the transparent electrode, wherein at least one of the red organic EL device, the green organic EL device, and the blue organic EL device has a delayed fluorescence material in the light-emitting layer; at least one of the other devices has a phosphorescence material in the light-emitting layer; and the reflective electrode has a soaking unit that is provided on a rear side of a light reflecting surface.

Due to the soaking that is achieved even when the organic EL device having the delayed fluorescence material and the organic EL device having the phosphorescence material are disposed on the same plane, uneven emission luminance is prevented.

Figure 1:
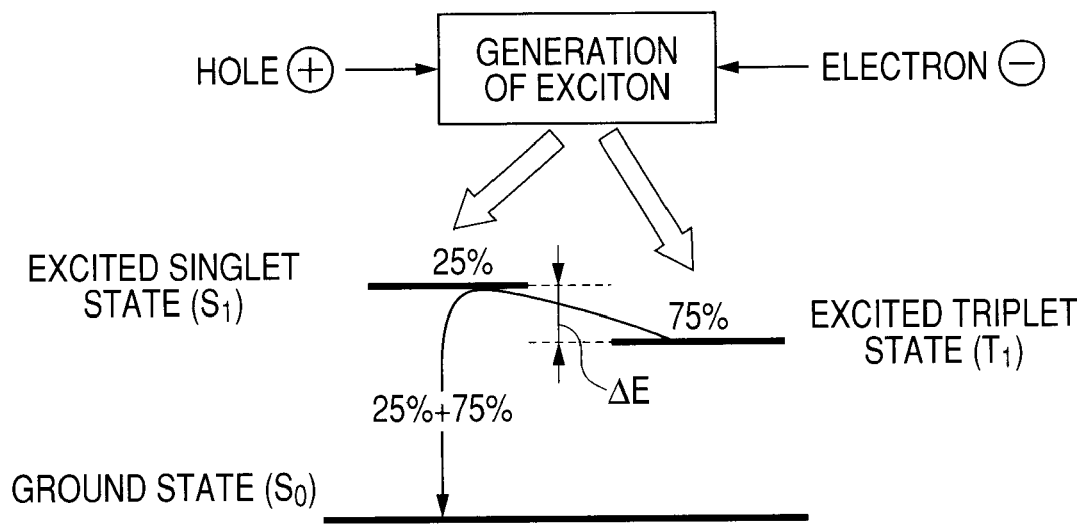
FIG. 1 is a diagram showing a light emission mechanism of delayed fluorescence.

Shown in FIG. 1 is a light emission mechanism in the case of using a delayed fluorescence material for a light-emitting layer of an organic EL device. Of excitons generated by recombination of holes and electrons in the light-emitting layer, 25% of the excitons are brought into an excited singlet state ($S_1$), and 75% of the excitons are brought into an excited triplet state ($T_1$) depending on the spin multiplicity. Since delayed fluorescence is thermally excited from $T_1$ to $S_1$ to emit light by electron transition from $S_1$ to $S_0$ it is possible to extract all of the excitons of $S_1$ and $T_1$ generated in the light-emitting layer as light. Therefore, in principle, it is possible to set an upper limit of internal quantum yield to 100% as in the case of phosphorescence.

The above-described delayed fluorescence utilizes thermal excitation from $T_1$ to $S_1$. Therefore, the delayed fluorescence in the present invention is a thermal excitation type delayed fluorescence.

Figure 2:
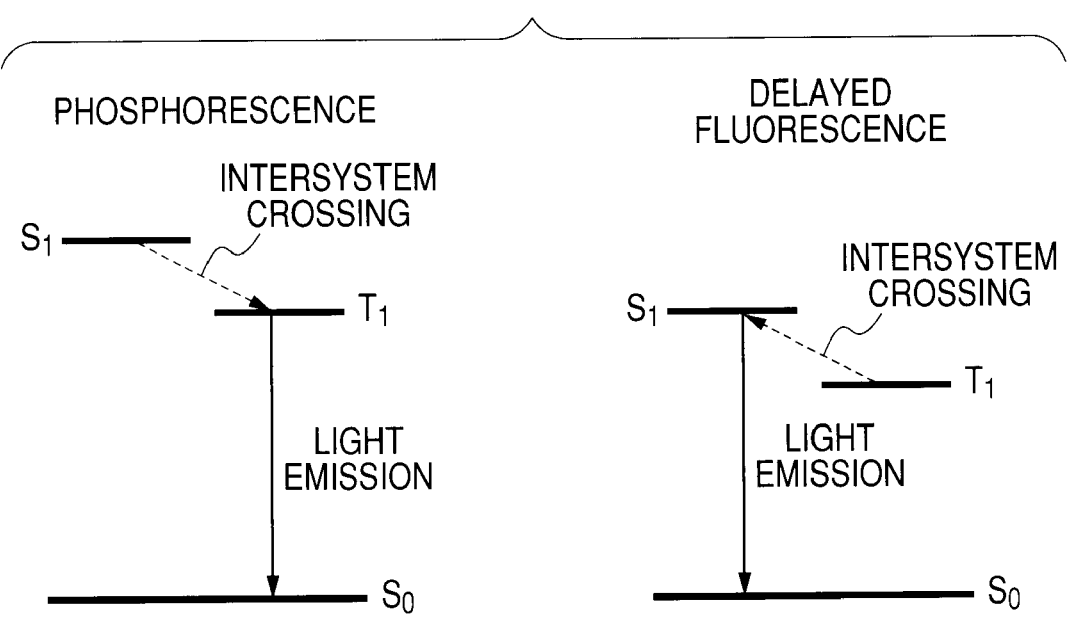
FIG. 2 is a diagram showing comparison between light emission mechanisms of delayed fluorescence and phosphorescence.

Hereinafter, with reference to FIG. 2 schematically showing energy levels when the delayed fluorescence and the phosphorescence have identical emission wavelengths, the energy levels are compared to one another. In FIG. 2, the energy level $T_1$ shown on the left and the energy level $S_1$ shown on the right are at the same level. This is for the purpose of the comparison between the delayed fluorescence and phosphorescence having the identical emission wavelengths. Focusing on an energy difference between $S_1$ and $S_0$ and an energy difference between $T_1$ and $S_0$ of each of the energy levels, the delayed fluorescence has the smaller energy differences than the phosphorescence. That is, it is understood that the delayed fluorescence has a smaller bandgap as compared to the case of the phosphorescence when the emission wavelengths are identical to each other.

Hereinafter, a case of using a light-emitting material having a small bandgap in the organic EL device will be described. The organic EL device has a single layer- or multilayer- organic layer that is disposed between an anode and a cathode. When holes are injected from the anode while injecting electrons from the cathode, due to an injection barrier from the electrode to the organic layer, the drive voltage strongly depends on the injection barrier. In the case where a plurality of organic layers are used, also, an injection barrier between the organic layers is likewise problematic. In the case of using a light-emitting material having a small bandgap, it is possible to reduce the injection barrier. As a result, holes are smoothly injected into the organic layer from the anode, and electrons are smoothly injected from the cathode to the organic layer. Therefore, it is possible to reduce the drive voltage of the organic EL device, thereby improving the power efficiency (lm/W) in accordance with the drive voltage reduction.

Examples of the delayed fluorescence material include a copper complex, a platinum complex, a palladium complex, and the like. The examples of the delayed materials are shown in <Formula 1> to <Formula 3>.

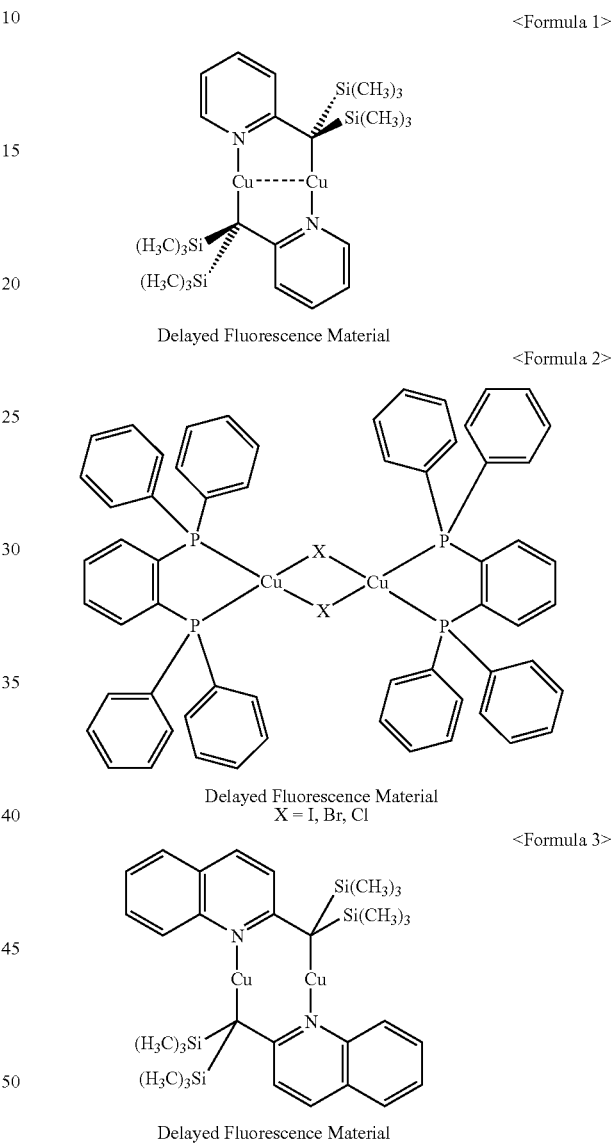

In the delayed fluorescence material to be used in the present invention, a light emission process can be specified to be delayed fluorescence by its light-emitting characteristics. The light emission of the delayed fluorescence material to be used in the present invention has the following properties.

1. An emission lifetime at room temperature (298 K) is at an order of microsecond.
2. An emission wavelength at room temperature (298 K) is shorter than an emission wavelength at a low temperature (77 K).
3. The mission lifetime at room temperature (298 K) is greatly shorter than an emission lifetime at a low temperature (77 K).

4. Emission intensity is increased by an increase in temperature.

In a comparison between an emission wavelength at room temperature and an emission wavelength at a low temperature of ordinary fluorescence and phosphorescence, the wavelengths are identical or the wavelength at the low temperature is shortened. In contrast, in the delayed fluorescence, the emission wavelength at a low temperature is lengthened. Such wavelength lengthening is caused since light emission is caused from an energy level of a triplet state which is lower than a singlet state although light emission from a singlet state is observed at room temperature. As used herein, the emission wavelength means a maximum emission wavelength or an emission start wavelength.

Also, the ordinary fluorescence has an emission lifetime at an order of nanosecond since the fluorescence is light emission from a singlet state, while the phosphorescence of which a triplet state is involved in light emission has an emission lifetime which is at an order of microsecond. Likewise, the delayed fluorescence has an emission lifetime at an order of microsecond since a triplet state is involved in light emission. The emission lifetime of a light-emitting material to be used in the present invention may preferably be 0.1 microsecond or more and less than one millisecond in a solid state or a solution state.

The emission lifetime of each of the delayed fluorescence and phosphorescence is at the order of microsecond. However, as the properties of the delayed fluorescence, the emission lifetime at a low temperature becomes greatly longer with respect to the emission lifetime at room temperature. For example, in the case of a phosphorescent compound having quantum yield of 0.1 at room temperature, the emission life time under an assumption that non-radiation deactivation is suppressed at the low temperature is 10 times the emission lifetime at room temperature at the maximum. In the case of the delayed fluorescence, since light emissions at low temperature and room temperature are caused from different excitation states, the emission lifetime strongly depends on the temperature. Since light emission is caused from the triplet state at the low temperature though the light emission is caused from the singlet state at room temperature, the emission lifetime at low temperature is more than 10 times the emission lifetime at room temperature and sometimes increased by two digits depending on the compound. The emission lifetime of the light-emitting material to be used in the present invention may preferably be 10 times or more, more preferably 50 times or more, further preferably 100 times of more, of the emission lifetime at room temperature in a solid state or a solution state. The foregoing is a method for discriminating the delayed fluorescence.

Figure 6:
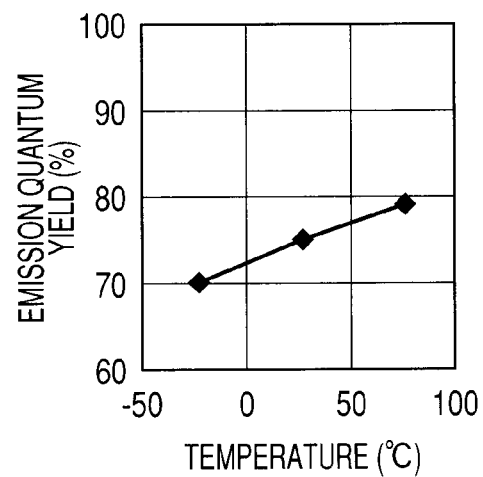
FIG. 6 is a diagram showing a correlation between emission quantum yield of a delayed fluorescence material and a temperature.

In the case of the delayed fluorescence, the light-emitting characteristics strongly depend on a temperature. For example, as shown in FIG. 6, the emission intensity (emission quantum yield) is increased with an increase in temperature. Unlike the phosphorescent material and the fluorescent material, the delayed fluorescence material shows strong temperature characteristics due to the emission mechanism that involves thermal excitation.

In contrast, in the case of phosphorescence, the temperature dependency of the light-emitting characteristics is smaller than the delayed fluorescence material. However, since the non-radiation deactivation rate is increased with an increase in temperature, the emission intensity tends to be reduced with an increase in temperature.

In short, in an organic EL display apparatus in which an organic EL device having a delayed fluorescence material and an organic EL device having a phosphorescent material are provided on the same substrate, the emission intensity of one of the devices is increased with an increase in temperature, while the emission intensity of the other device is reduced with the increase in temperature. Therefore, the present inventors have found that it is important to prevent the temperature increase in the organic EL display apparatus in which the organic EL device having the delayed fluorescence material and the organic EL device having the phosphorescent material are provided on the same substrate. More specifically, a devisal for soaking of a display surface by means of a soaking unit is provided.

In the present invention, at least one of the red organic EL device, the green organic EL device, and the blue organic EL device has a delayed fluorescence material in the light-emitting layer. At least one of the other devices has a phosphorescent material in the light-emitting layer. Each of the red organic EL device, the green organic EL device, and the blue organic EL device may independently have either one of the delayed fluorescence material or the phosphorescent material in the light-emitting layer, but one of the red organic EL device, the green organic EL device, and the blue organic EL device may have a fluorescent material.

Hereinafter, the organic EL display apparatus will be described in detail. As shown in FIG. 3, the organic EL display apparatus of the present invention is provided with pixels arranged in a matrix pattern, a data signal line driver 302 for driving a data signal line wired for each of pixel rows, and a scanning signal line driver 301 for driving a scanning signal line wired for each of pixel lines. In the figure, R, G, and B indicate a red-light-emitting pixel, green-light-emitting pixel, and blue-light-emitting pixel, respectively. Each of the pixels has an organic EL device corresponding to the color. Furthermore, each of the pixels has a TFT device for controlling luminance of the organic EL device. As shown in the figure, the pixels are connected by row and by line each by way of a common wiring. Each of the wirings is connected to the data signal line driver 302 or the scanning signal line driver 301.

The pixels of R, G, and B (RGB pixels) may be arranged in various orders without limitation instead of the order shown in FIG. 3.

Figure 7:
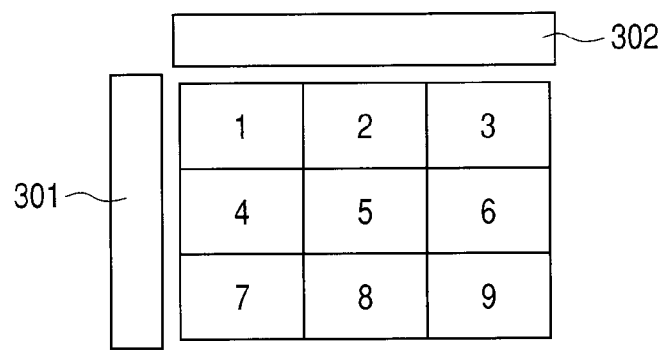
FIG. 7 is a block diagram in which a pixel region of an organic EL display apparatus is divided.

FIG. 7 is a diagram showing the pixel region which is divided for the brevity of explanation. In FIG. 7, the RGB pixels are not indicated, however, the pixel region is divided into 9 regions, and numbers 1 to 9 are respectively indicated in the regions. The regions 1 to 3 are regions close to the data signal line driver. The regions 1, 4, and 7 are the regions close to the scanning signal line driver. The temperature of each of the pixel regions in the present invention means an average temperature of the pixels existing in four corners in each of the regions of the pixel regions 1 to 9. Here, the pixel region 1, for example, is the most subject to temperature increase (referred to as high temperature pixel region, and the temperature thereof being indicated as TH) as compared to other pixel regions, while the pixel region 9 is the least subject to temperature increase (referred to as low temperature pixel region, and the temperature thereof being indicated as TL). In the case where TH−TL is large, uneven luminance of the organic EL display apparatus as a whole is prominent due to the temperature difference.

Also, as described above, the delayed fluorescence material is increased in emission intensity with an increase in temperature, while the phosphorescence material has the temperature characteristics that the emission intensity is lowered or kept constant along with an increase in temperature. Therefore, in the organic EL display apparatus including the organic EL device having the delayed fluorescence material and the organic EL device having the phosphorescent material, uneven luminance as the whole display apparatus is increased with an increase in TH–TL.

FIG. 4 is a block diagram showing the organic EL device having the soaking unit. In FIG. 4, in the organic EL device 601, an organic function layer 602 in which organic compound layers are stacked, an upper electrode (reflective electrode 603) serving as the cathode, and a lower electrode (transparent electrode 607) serving as the anode are stacked. The reflective electrode and the transparent electrode are opposed to each other.

The organic function layer 602 has a hole transport layer 606, a light-emitting layer 605, and an electron transport layer 604.

The organic EL device 601 further has a protective film 608, and a radiating member 609 is provided on the protective film 608.

The organic EL display apparatus according to the present invention has a plurality of the organic EL devices shown in FIG. 4. Namely, the radiating member 609 is disposed on all of the pixel regions.

Here, examples of the soaking unit in the present invention include the following two types.
1. The radiating member is provided in all of the pixel regions of the display apparatus to achieve soaking by heat radiation. Since heat transfer from the high temperature side pixels to the low temperature side pixels is also caused, the soaking reduces the temperature difference in the whole pixel regions. Furthermore, the radiating member may be locally provided on the pixel regions of the display apparatus for radiating heat to achieve soaking of the whole pixel regions.
2. The wiring pattern of the display apparatus is devised to prevent local concentration of heat, thereby achieving soaking in such a manner that the temperature difference in the whole pixel regions is reduced.

The radiating member of (1) specifically is the soaking achieved by the provision of a member having high heat conductivity in the whole pixel regions of the display apparatus. The radiating member may preferably have high heat conductivity. FIG. 5 is a diagram showing heat conductivities of substances. The shape of the radiating member is not particularly limited, and the radiating member may not necessarily be in the form of a plate or a sheet. In order to enhance the effect of heat conduction, a surface area may be increased by forming an unevenness structure on the member. Also, the radiating member may be provided at a plurality of parts. In the organic EL device shown in FIG. 4, the reflective electrode 603 is the upper electrode, and the transparent electrode 607 is the lower electrode. In short, light is extracted toward a lower side in the drawing in FIG. 4. The radiating member 609 is disposed on a rear side of the reflective electrode. A substrate (not shown) supporting the organic EL device of FIG. 4 may be provided outside the radiating member of the organic EL device 601 or may be provided at a lower electrode side.

Also, the RGB pixels have the same positional relationship of the reflective electrode and the transparent electrode. That is, when the reflective electrode is provided in an upper part of the drawing with the transparent electrode being provided in a lower part of the drawing in one organic EL device as shown in FIG. 4, such positional relationship is established between the reflective electrode and the transparent electrode in each of the other organic EL devices.

When the organic EL display apparatus is of the top emission type, i.e. the type of externally discharging light without transmitting the substrate, the radiating member may be provided on both of front and rear sides of the support substrate disposed at a reflective electrode side. Also, the thickness of the radiating member is not limited insofar as the thickness allows satisfactory confirmation of the heat radiation effect. The thickness may preferably be about 500 nm or more and about 3 mm or less.

Furthermore, in the case of soaking the whole pixel regions by locally allowing heat radiation by providing the radiating member only at a part in which heat generation amount is large, the type, shape, and thickness of the radiating member may be the same as those described above. In order to further enhance the soaking effect, a plurality of types of radiating members may be provided, for example, in such a manner that a radiating member of which a type may be the same or different from the aforementioned radiating member is locally provided in addition to the radiating member that is provided in the whole pixel regions.

Figure 8:
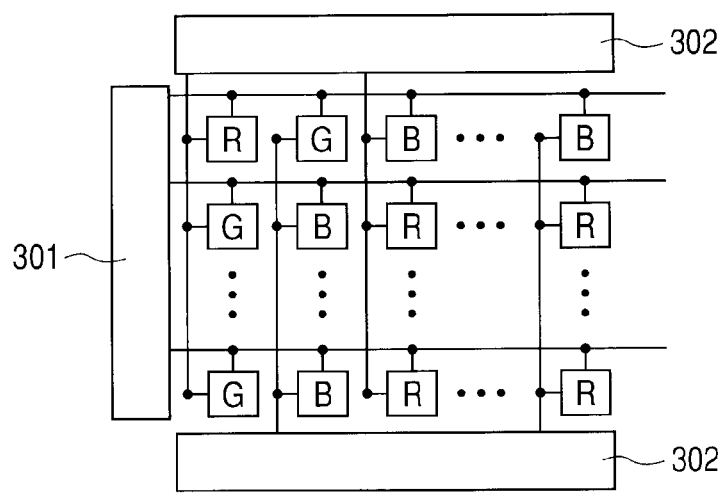
FIG. 8 is a block diagram schematically showing a structure of an organic EL display apparatus of Example 6 and disposition of RGB pixels thereof.

One of specific examples of the soaking unit (2) is a zigzag wiring. By the zigzag wiring, in the case of connecting a wiring pattern to a display apparatus in which the data signal line drivers are disposed at upper and lower edges as shown in FIG. 8, data signal lines of odd numbers (i.e., 1st, 3rd, 5th, . . . ) in the column direction are connected to the upper data signal line driver, and the data signal lines of even numbers (i.e., 2nd, 4th, 6th, . . . ) are connected to the lower data signal line driver. By such wiring, it is possible to supply display data to the pixels from the data signal line drivers at the upper and lower edges. The wiring is disposed outside the organic EL device, specifically at a side opposite to a light extraction side of the organic EL device, more specifically at a side opposite to the light reflection surface of the reflective electrode of the organic EL device.

Likewise, in the case of connecting a wiring pattern to a display apparatus in which the scanning signal line drivers are disposed at left and right edges, scanning signal lines of odd numbers in the row direction may be connected to the left scanning signal line driver, and the scanning signal lines at even numbers may be connected to the right scanning signal line driver.

Thus, it is possible to prevent local concentration of heat since the heat is easily transmitted to adjacent pixels as compared to the case wherein display data are supplied to the pixels in one direction from one of the signal line drivers. As a result, it is possible to soak the whole pixel regions of the display apparatus. In the case of (2), it is unnecessary to provide the radiating member of (1).

Also, an organic EL display apparatus having both of the above-described two soaking units may be created. Thus, the soaking effect is further enhanced to make it possible to further suppress the uneven luminance between the pixel regions.

The organic function layer 602 may be formed only of the light-emitting layer. Alternatively, for the purpose of achieving high efficiency, the organic function layer 602 may be formed of a plurality of layers such as a carrier blocking layer and an exciton blocking layer that are to be disposed adjacent to the light-emitting layer. For the organic function layer 602 to be used for the organic EL devices, the layer structure for each of the colors is formed by combining layers that are appropriately selected from an electron transport layer, a light-emitting layer, a hole transport layer, a carrier blocking layer, and an exciton blocking layer.

Each of the organic EL devices of the RGB pixels has any one of the delayed fluorescence material, the phosphorescent material, and the fluorescent material. It is possible to independently select the material to be used for the light emission of each of the colors.

As the transparent electrode indicated by the lower electrode 607 as the cathode, it is possible to use an oxide conductive film, more specifically, a compound film ITO (Indium Tin Oxide) of indium oxide and tin oxide, an indium oxide/zinc oxide-based amorphous material (Indium Zinc Oxide: IZO), and the like. These are transparent electrodes. As a method for forming the transparent electrode, a sputtering method, a vacuum evaporation method, an ion plating method, or the like may be employed, and the thickness is not particularly limited.

Examples of the hole transport layer 606 provided on the lower electrode 607 which is indicated as the anode include, for example, α-NPD (Formula 4). The hole transport layer may be a material other than α-NPD. Specific examples of the material include a conductive polymer or the like, such as an arylamine derivative, a carbazole derivative, and a poly(ethylenedioxythiophene) (PEDOT-PSS).

<Formula 4>

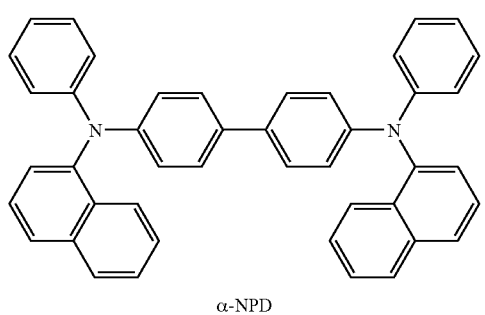

α-NPD

Examples of a host material of the light-emitting layer include, for example, CBP (Formula 5). Other materials may be used without particular limitation insofar as the material has a bandgap that is higher than emission energy of the light-emitting material (guest material) of each of the colors.

<Formula 5> CBP

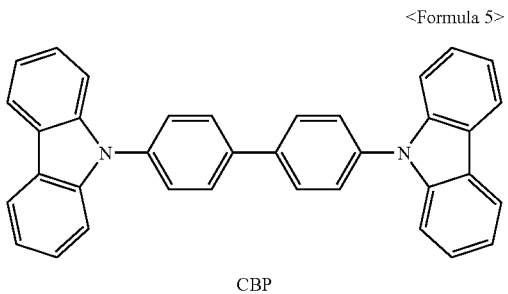

CBP

As the guest material of the light-emitting layer, for each of the organic EL devices other than the organic EL device having the delayed fluorescence material, an organic compound that is appropriate for the emission color may be selected. For example, a phosphorescent material such as $Btp_2Ir(acac)$ (red), $Ir(ppy)_3$ (green), FIr6 (blue) may be used, or a fluorescent material such as BPPC (red), $Bebq_2$ (green), DPVBi (blue), and Spiro-TAD may be used.

As used herein, the host material in the light-emitting layer is the organic compound having a relatively large weight ratio of a plurality of organic compounds forming the light-emitting layer. The organic compound having a relatively small weight ratio is referred to as a guest material.

Examples of the electron transport layer include BCP (Formula 6) which has an electron-accepting property, but materials other than BCP may be used. For example, it is possible to use Bphen, BAlq, a metal complex of quinolinol derivative, and the like.

<Formula 6>

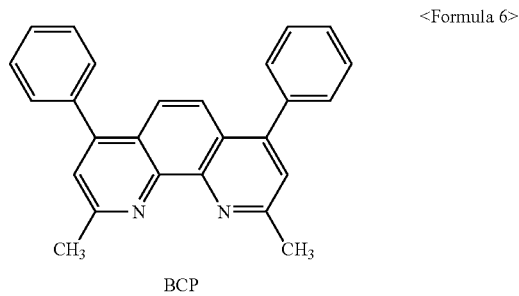

BCP

The cathode indicated as the upper electrode 603 is provided on the electron transport layer 604. For the upper electrode, a metal or an alloy having a small work function is used. For example, a metal such as silver, aluminum, and chromium, alloys thereof, and the like are used.

As described above, in the present embodiment, the anode is the transparent electrode that transmits light, and the cathode is the reflective electrode that reflects light. In the organic EL device according to the present invention, the anode may be the reflective electrode, while the cathode may be the transparent electrode.

As the protective film 60 to be provided on the upper electrode 603, a ceramic film such as of silicon oxynitride, silicon nitride, and the like may be used. Other materials may be used without particular limitation insofar as the material protects the organic function layer 602 from adverse influences of moisture (water vapor) and oxygen. The thickness thereof is not particularly limited and may preferably be 500 nm or more and 1 μm or less. In the present embodiment, the radiating member is provided on the protective film. When light is extracted via the protective film, the protective film needs to be transparent.

EXAMPLE 1

The present example is an organic EL display apparatus having a structure in which a green organic EL device has a delayed fluorescence material in a light-emitting layer; a red organic light-emitting device and a blue organic light-emitting device have a phosphorescent material in light-emitting layers; and light emitted from the organic EL devices is extracted via a substrate having the organic EL devices.

As shown in FIGS. 3 and 4, the organic EL display apparatus having the organic EL devices emitting three colors of RGB was produced by a method described below. The organic EL display apparatus had a structure that RGB pixels are arranged in the matrix pattern as shown in FIG. 3.

A panel which was produced to serve as a pixel region was 42 inches in width across corners, and had 1080 pixels in a vertical direction, 1920 pixels in a horizontal direction, and an aperture ratio of RGB pixels of 40%. The term "aperture ratio" herein employed refers to a ratio of an area occupied by all the pixels to an area of a region in which the pixels are provided. A region which is not occupied by the pixels of the pixel region is a gap region between adjacent pixels.

On a glass (glass substrate) serving as a support member which is a substrate, TFT drive circuits made from low temperature polysilicon were formed, and a planarizing film made from an acrylic resin was formed on the TFT circuits. On the planarizing film, 120 nm of ITO to be used as a transparent electrode was formed by a sputtering method, followed by patterning to form an anode. Furthermore, a pixel separation film was formed by using an acrylic resin to produce an anode side transparent electrode substrate. The anode side transparent electrode substrate was subjected to ultrasonic cleaning with isopropyl alcohol (IPA), followed by washing with boiled IPA and drying. After that, UV/$O_3$ cleaning was performed, and a hole transport layer, organic light-emitting layers corresponding to RGB pixels, an electron transport layer, an electron injection layer, and a cathode material were sequentially formed by vacuum evaporation.

As the hole transport layer, a film of 24 nm in thickness was formed by performing vacuum evaporation of α-NPD shown in (Formula 4) under the condition of a vacuum degree of $3.0 \times 10^{-5}$ Pa. After that, the organic light-emitting layers corresponding to RGB pixels were coated on the same substrate by using a mask corresponding to an emission pattern. At that time, for the light-emitting layer for the R pixel, CBP shown in (Formula 5) was used as a host material, and the phosphorescence material Ir(piq)$_3$ (Formula 7) shown below was used as a guest material. The ratio of the guest material to the host material was set to 5.0 mass % by concentration, and the light-emitting layer of 20 nm in thickness was formed by the co-evaporation method under the condition of a vacuum degree of $3.0 \times 10^{-5}$ Pa.

<Formula 7>

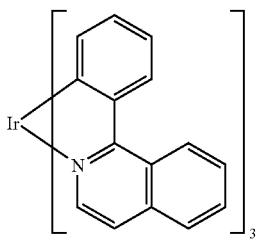

Phosphorescence material Ir(piq)$_3$: 5.0 mass %

The G pixel was formed in the same manner as in the case of the R pixel except for forming the light-emitting-layer by using the delayed fluorescence material (Formula 1) as the guest material and setting the ratio thereof to the host material to 5.0 mass % by concentration. The B pixel was formed in the same manner as in the case of the R pixel except for forming the light-emitting layer by using FIrpic (Formula 8) which is the phosphorescent material as the guest material.

<Formula 8>

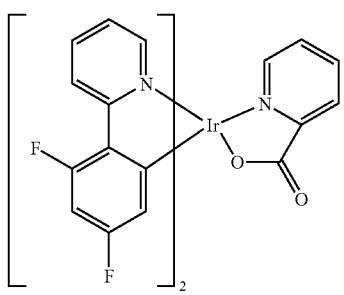

Phosphorescent Material FIrpic: 5.0 mass%

Next, as the electron transport layer, a film of 50 nm in thickness was formed by depositing BCP (Formula 6) by a vacuum evaporation method under the condition of a vacuum degree of $3.0 \times 10^{-5}$ Pa. Subsequently, as the electron injection layer, a film of 1 nm in thickness was formed by depositing potassium fluoride (KF) by a vacuum evaporation method under the condition of a vacuum degree of $2.0 \times 10^{-4}$ Pa. After that, a film of 100 nm in thickness was formed by using Al as a material for the cathode which is the reflective electrode and by employing a vacuum evaporation method under the condition of a vacuum degree of $2.0 \times 10^{-4}$ Pa, thereby obtaining the organic EL device having the structure shown in FIGS. 3 and 4 in which the RGB pixels were arranged in a matrix pattern. Furthermore, as the protective film, a film of 700 nm in thickness was formed by using silicon nitride. Sheet-like graphite having a thickness of 0.5 mm was provided on portions corresponding to the pixel regions 1 to 9 of FIG. 7 above the protective film, i.e. on a rear side of a light extracting side of the reflective electrode, followed by sealing, thereby obtaining an organic EL display apparatus.

The thus-produced organic EL display apparatus was caused to display for 15 minutes stably at a display apparatus rear side temperature before start of display of 25° C. and a front initial luminance of 1000 cd/m$^2$, and then the display apparatus rear side temperature and the front surface luminance of each of the pixel regions shown in FIG. 7 were measured. The region 1 was TH, and the region 9 was TL, in which TH−TL=4° C. was measured (TH=40° C., TL=36° C.) Also, as the front surface luminance, 1050 cd/m$^2$ was measured in TH, and 1030 cd/m$^2$ was measured in TL. All of RGB pixels emitted light during the luminance measurement.

COMPARATIVE EXAMPLE 1

An organic EL display apparatus was produced by following the same procedure as in Example 1 except for omitting the sheet-like graphite provided above the protective film in the organic EL display apparatus production of Example 1.

The thus-produced organic EL display apparatus was caused to display continuously under the same conditions as those of Example 1, and then a display apparatus rear side temperature and front surface luminance of each of the pixel regions shown in FIG. 7 were measured.

The region 1 was TH, and the region 9 was TL, in which TH−TL=30° C. was measured (TH=74° C., TL=44° C.). Also, as the front surface luminance, 1200 cd/m$^2$ was measured in TH, and 1060 cd/m$^2$ was measured in TL.

EXAMPLE 2

The present example is an organic EL display apparatus having a structure in which a green organic EL device and a red organic EL device have a delayed fluorescence material in light-emitting layers; and the blue organic light-emitting device has a phosphorescent material in a light-emitting layer; and light emitted from the organic EL devices is extracted outside via a substrate having the organic EL devices. In terms of the organic EL device formation, the organic EL display apparatus was produced by following the same procedure as in Example 1 except for forming the light-emitting layer of the R pixel by using the delayed fluorescence material (Formula 3) as the guest material and setting the ratio of the guest material to the host material to 5.0 mass % by concentration.

The thus-produced organic EL display apparatus was caused to display continuously under the same conditions as those of Example 1, and then a display apparatus rear side temperature and front surface luminance of each of the pixel regions shown in FIG. 7 were measured. The region 1 was TH, and the region 9 was TL, in which TH−TL=5° C. was measured (TH=43° C., TL=38° C.). Also, as the front surface luminance, 1060 cd/m² was measured in TH, and 1040 cd/m² was measured in TL.

COMPARATIVE EXAMPLE 2

An organic EL display apparatus was produced by following the same procedure as in Example 2 except for omitting the sheet-like graphite provided above the protective film in the organic EL display apparatus production of Example 2.

The thus-produced organic EL display apparatus was caused to display continuously under the same conditions as those of Example 1, and then a display apparatus rear side temperature and front surface luminance of each of the pixel regions shown in FIG. 7 were measured. The region 1 was TH, and the region 9 was TL, in which TH−TL=31° C. was measured (TH=78° C., TL=47° C.). Also, as the front surface luminance, 1250 cd/m² was measured in TH, and 1060 cd/m² was measured in TL.

EXAMPLE 3

The present example is an organic EL display apparatus having a structure in which a green organic EL device has a delayed fluorescence material in a light-emitting layer; and a red organic light-emitting device and a blue organic light-emitting device have a phosphorescent material in light-emitting layers; and light emitted from the organic EL devices is extracted outside without transmitting a substrate having the organic EL devices.

The organic EL display apparatus formed of three colors of RGB having the structure shown in FIGS. 3 and 4 was produced by a method described below. The display apparatus had a structure that RGB pixels are arranged in a matrix pattern as shown in FIG. 3 as is the case in Example 1.

A panel was so produced as to be 42 inches in width across corners and to have 1080 pixels in a vertical direction, 1920 pixels in a horizontal direction, and an aperture ratio of 70%.

On a glass substrate serving as a support member, sheet-like graphite serving as the radiating member and having a thickness of 0.5 mm was disposed. TFT drive circuits made from low temperature polysilicon were formed on the sheet-like graphite, and a planarizing film made from an acrylic resin was formed on the TFT drive circuits. Above the planarizing film, a film having a thickness of 100 nm to be used as a reflective electrode was formed by sputtering a silver alloy (AgCuNd) by a sputtering method, followed by patterning, and an anode serving as a lower electrode was formed by forming a film having a thickness of 30 nm by sputtering IZO by a sputtering method, followed by patterning. That is, the radiating member was disposed on a side opposite to a reflective side of the reflective electrode.

Furthermore, a pixel separation film was formed by using an acrylic resin to produce an anode side electrode substrate. The anode side electrode substrate was subjected to ultrasonic cleaning with IPA, followed by washing with boiled IPA and drying. After that, UV/$O_3$ cleaning was performed, and organic function layers corresponding to RGB pixels were provided in accordance with the procedure described below.

The organic function layers corresponding to RGB pixels were differently coated by performing evaporation on the same substrate by using a mask corresponding to an emission pattern. A hole transport layer of 24 nm in thickness was formed by depositing α-NPD shown in (Formula 4) by the vacuum evaporation under the condition of a vacuum degree of $3.0 \times 10^{-5}$ Pa.

Subsequently, as the light-emitting layers, different coatings were performed for the light-emitting layers corresponding to the RGB pixels. The combination of the host material and the guest material for each of the colors of the organic EL devices was the same as that of Example 1. The thicknesses of the light-emitting layers were different from those of Example 1. For the R pixel, CBP shown in (Formula 5) was used as the host material, and the delayed fluorescent material shown in (Formula 3) was used as the guest material. The ratio of the guest material to the host material was set to 5.0 vol % by concentration, and the light-emitting layer of 70 nm in thickness was formed by a co-evaporation method under the condition of a vacuum degree of $3.0 \times 10^{-5}$ Pa. The G pixel was formed by using CBP shown in (Formula 5) as the host material and using the delayed fluorescent material shown in (Formula 1) as the guest material. The ratio of the guest material to the host material was set to 5.0 vol % by concentration, and the light-emitting layer of 65 nm in thickness was formed by a co-evaporation method under the condition of a vacuum degree of $3.0 \times 10^{-5}$ Pa.

The B pixel was formed by using CBP shown in (Formula 5) as the host material and using the phosphorescent material FIrpic shown in (Formula 8) as the guest material. The ratio of the guest material to the host material was set to 5.0 vol % by concentration, and the light-emitting layer of 40 nm in thickness was formed by a co-evaporation method under the condition of a vacuum degree of $3.0 \times 10^{-5}$ Pa.

Next, as the electron transport layer, a film of 10 nm in thickness was formed by depositing BCP (Formula 6) by a vacuum evaporation method under the condition of a vacuum degree of $3.0 \times 10^{-5}$ Pa. Furthermore, as another electron transport layer, a film of 14 nm in thickness was formed by co-evaporation of BCP and $Cs_2CO_3$ (weight ratio: 9:1) under the condition of a vacuum degree of $2.0 \times 10^{-4}$ Pa. As cathode, a film of 15 nm in thickness was formed by depositing silver (Ag) by a vacuum evaporation method under the condition of a vacuum degree of $2.0 \times 10^{-4}$ Pa. This cathode was used as the transparent electrode. Furthermore, as the protective film, a film of 700 nm in thickness of silicon nitride was formed to perform sealing, thereby obtaining the organic EL display apparatus. In each of the organic EL devices, the reflective electrode is disposed at a position close to the substrate, and the transparent electrode opposed to the reflective electrode is disposed at a position distant from the substrate as compared to the reflective electrode. Lights emitted from the light-emitting layers include the light that directly exits through the transparent electrode, and the light that exits after being reflected by the reflective electrode.

The thus-produced organic EL display apparatus was caused to display continuously under the same conditions as those of Example 1, and then a display apparatus rear side temperature and front surface luminance of each of the pixel regions shown in FIG. 7 were measured.

The region 1 was TH, and the region 9 was TL, in which TH−TL=4° C. was measured (TH=44° C., TL=40° C.). Also, as the front surface luminance, 1070 cd/m² was measured in TH, and 1050 cd/m² was measured in TL.

COMPARATIVE EXAMPLE 3

An organic EL display apparatus was produced by following the same procedure as in Example 3 except for omitting the sheet-like graphite in the organic EL display apparatus production of Example 3.

The thus-produced organic EL display apparatus was caused to display continuously under the same conditions as those of Example 1, and then a display apparatus rear side temperature and front surface luminance of each of the pixel regions shown in FIG. 7 were measured. The region 1 was TH, and the region 9 was TL, in which TH−TL=31° C. was measured (TH=77° C., TL=46° C.). Also, as the front surface luminance, 1240 cd/m² was measured in TH, and 1070 cd/m² was measured in TL.

EXAMPLE 4

An organic EL display apparatus was produced by following the same procedure as in Example 3 except for providing sheet-like graphite having a thickness of 0.5 mm on each of both sides of the glass substrate serving as the support.

The thus-produced organic EL display apparatus was caused to display continuously under the same conditions as those of Example 1, and then a display apparatus rear side temperature and front surface luminance of each of the pixel regions shown in FIG. 7 were measured.

The region 1 was TH, and the region 9 was TL, in which TH−TL=2° C. was measured (TH=38° C., TL=36° C.). Also, as the front surface luminance, 1030 cd/m² was measured in TH, and 1020 cd/m² was measured in TL. Therefore, it was confirmed that uneven luminance due to the temperature difference between pixel regions was suppressed as compared to Example 3.

EXAMPLE 5

An organic EL display apparatus was produced by following the same procedure as in Example 4 except for providing a copper plate having a thickness of 3 mm at a part corresponding to the pixel regions 1, 4, and 7 of FIG. 7 on a side from which the light does not exit.

The thus-produced organic EL display apparatus was caused to display continuously under the same conditions as those of Example 1, and then a display apparatus rear side temperature and front surface luminance of each of the pixel regions shown in FIG. 7 were measured.

The region 1 was TH, and the region 9 was TL, in which TH−TL=1° C. was measured (TH=37° C., TL=36° C.). Also, as the front surface luminance, 1025 cd/m² was measured in TH, and 1020 cd/m² was measured in TL. Therefore, it was confirmed that uneven luminance due to the temperature difference between pixel regions was suppressed as compared to Example 4.

EXAMPLE 6

The present example has a structure in which light is extracted without transmitting a substrate. Radiating members were provided at both sides of the substrate, and the wiring was arranged as shown in FIG. 8. The RGB pixel arrangement, panel size, number of pixels in the display apparatus, and the aperture ratio of RGB pixels were the same as those of Example 4.

In the case of connecting the wiring pattern to the display apparatus in which the data signal line drivers are disposed both of upper and lower ends as shown in FIG. 8, the data signal lines of odd numbers were connected to the upper data signal line driver, and the data signal lines of even numbers were connected to the lower data signal line drivers.

The thus-produced organic EL display apparatus was caused to display continuously under the same conditions as those of Example 1, and then a display apparatus rear side temperature and front surface luminance of each of the pixel regions (same as the regions 1 to 9 shown in FIG. 7) were measured.

The region 1 was TH, and the region 9 was TL, in which TH−TL=2° C. was measured (TH=43° C., TL=41° C.). Also, as the front surface luminance, 1060 cd/m² was measured in TH, and 1055 cd/m² was measured in TL.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2008-264193, filed Oct. 10, 2008, and No. 2009-222634, filed Sep. 28, 2009, which are hereby incorporated by reference herein in their entirety.

What is claimed is:

1. An organic EL display apparatus comprising:
   a plurality of pixels on a substrate,
   the plurality of pixels including a red-light-emitting pixel, a green-light-emitting pixel, and a blue-light-emitting pixel, and the red-light-emitting pixel, the green-light-emitting pixel, and the blue-light-emitting pixel having a red organic EL device, a green organic EL device, and a blue organic EL device, respectively,
   each of the red organic EL device, the green organic EL device, and the blue organic EL device having a reflective electrode, a transparent electrode opposed to the reflective electrode, and a light-emitting layer disposed between the reflective electrode and the transparent electrode, and
   the reflective electrode in each of the red organic EL device, the green organic EL device, and the blue organic EL device being disposed distant from or close to the substrate as compared to the transparent electrode, wherein
   at least one of the red organic EL device, the green organic EL device, and the blue organic EL device has a delayed fluorescence material in the light-emitting layer;
   at least one of the other devices has a phosphorescence material in the light-emitting layer; and
   the reflective electrode has a soaking unit that is provided on a rear side of a light reflecting surface.

2. The organic EL display apparatus according to claim 1, wherein
   a radiating member which is the soaking unit is provided on each of front and rear surfaces of the substrate; and
   the reflective electrode is disposed close to the substrate as compared to the transparent electrode in each of the red organic EL device, the green organic EL device, and the blue organic EL device.

* * * * *